United States Patent
Lubomirsky

(12) 
(10) Patent No.: US 7,209,518 B1
(45) Date of Patent: Apr. 24, 2007

(54) HIGHER PWM RESOLUTION FOR SWITCHMODE POWER SUPPLY CONTROL

(75) Inventor: Vadim Lubomirsky, Rochester, NY (US)

(73) Assignee: MKS Instruments, Inc., Wilmington, MA (US)

( * ) Notice: Subject to any disclaimer, the term of this patent is extended or adjusted under 35 U.S.C. 154(b) by 882 days.

(21) Appl. No.: 09/632,180

(22) Filed: Aug. 3, 2000

(51) Int. Cl.
*G05F 1/00* (2006.01)
*H03K 7/08* (2006.01)

(52) U.S. Cl. ............ 375/238; 323/271; 713/300; 713/323

(58) Field of Classification Search ............ 375/238, 375/242, 355; 713/300, 310, 323; 323/271
See application file for complete search history.

(56) References Cited

U.S. PATENT DOCUMENTS

| | | | |
|---|---|---|---|
| 3,633,113 A | 1/1972 | Grubel et al. | |
| 3,739,199 A | 6/1973 | Negrou | |
| 3,913,021 A | 10/1975 | McCarthy et al. | |
| 4,257,108 A | 3/1981 | Igel | |
| 4,833,375 A * | 5/1989 | Del Signore, II | 318/269 |
| 4,837,672 A | 6/1989 | Donze | |
| 4,910,448 A | 3/1990 | Tomisawa et al. | |
| 5,077,488 A | 12/1991 | Davis | |
| 5,119,045 A | 6/1992 | Sato | |
| 5,144,265 A | 9/1992 | Petzold | |
| 5,177,373 A | 1/1993 | Nakamura | |
| 5,475,296 A | 12/1995 | Vinsant et al. | |
| 5,506,484 A | 4/1996 | Munro et al. | |
| 5,594,324 A | 1/1997 | Canter et al. | |
| 5,675,297 A * | 10/1997 | Gose et al. | 332/109 |
| 5,815,383 A | 9/1998 | Lei | |
| 5,901,054 A | 5/1999 | Leu et al. | |
| 6,011,679 A * | 1/2000 | Ng et al. | 361/18 |
| 6,232,604 B1 * | 5/2001 | McDaniel et al. | 250/363.03 |
| 6,333,654 B1 * | 12/2001 | Harris et al. | 327/170 |
| 6,390,579 B1 * | 5/2002 | Roylance et al. | 347/9 |
| 6,804,788 B1 * | 10/2004 | Lubomirsky et al. | 713/300 |

* cited by examiner

*Primary Examiner*—Kevin Burd
(74) *Attorney, Agent, or Firm*—Harness, Dickey & Pierce P.L.C.

(57) ABSTRACT

A pulse width modulation controlling circuit for a power supply and method for controlling a switchmode power supply is disclosed. The present invention accomplishes control over the switching of the power supply by coarsely and then finely adjusting a time-length signal.

17 Claims, 9 Drawing Sheets

HIGHER PWM RESOLUTION FOR SWITCHMODE POWER SUPPLY CONTROL

FIELD OF THE INVENTION

The present invention relates to a pulse width modulation (PWM) controlling circuit, and more particularly, to a pulse width modulation controlling circuit for a switchmode power supply in a wide variety of electronics.

BACKGROUND OF THE INVENTION

As electronic technologies continue to develop, the need for precise, robust, and easily tunable pulse width modulation power supplies also increases. This need is felt in virtually any area of technology that requires precise control over the pulse width emitted from a power supply. It is needed, by way of example, in technologies ranging from the power supplies in personal computers and other consumer electronics, to the high power demands of plasma generating technologies used in chip manufacturing.

For example, there exists in the chip manufacturing field a need for such a precise, robust, and easily tunable pulse width modulation power supply control. As chip manufacturing technologies develop, the capability to increase the number of elements on a semiconductor chip also increases. It is beneficial to increase the number of elements on a semiconductor because as the element density on the semiconductor chips increase, the capabilities of the chip also increases. For example, with higher densities, a chip may perform a greater number of operations in a given clock cycle.

In order to manufacture a chip, the pathways, interconnections, and elements must be etched on a substrate. This etching process is most commonly accomplished in a plasma chamber. During the etching process, the input power to the plasma chamber is switched on and off according to the patterns and the interconnections being etched on the substrate. As would be expected, as the desired chip density increases, the level of control and precision required of the input power to the plasma chamber during the etching process also increases. The smaller and closer together elements on the chip are, the smaller the duration of the "on" and "off" periods of the power supply may be.

Accordingly, in order for the plasma chamber to properly etch a high-density substrate, it must be capable of regulating the applied power to the plasma chamber quickly and precisely. The power supply to the plasma chamber must thus be capable of fine control of output power.

Present control circuitry for power supplies are, however, incapable of providing sufficient pulse width resolution. One reason is that their control circuitry simply runs at an insufficiently high clock frequency.

Accordingly, one attempt to overcome this deficiency in present power supplies has been to use control chips within the power supply that are capable of responding to higher clock frequencies, and to drive these chips with a higher clock frequency.

For example, the use of discrete ECL logic chips driven by a one gigahertz oscillator would provide a very quick reaction time in the power supply, which would allow the power supply to provide very short time intervals and durations of power input to the plasma chamber. This method, however, has several drawbacks. First, the required circuitry is relatively large and therefore occupies valuable space on the circuit board. Second, the higher clock frequency required consumes a large amount of power. Therefore, the circuit can become expensive to operate due to the larger power requirements, and may require additional cooling, due to increased heat generation. Lastly, the higher frequency components themselves can be very expensive.

Another attempt to overcome the above deficiencies has been to use analog control circuitry rather than higher frequency digital circuitry. By using analog circuitry to control the switching of the power supply, many of the above disadvantages are remedied. The circuitry itself is comparatively inexpensive. Moreover, due to its asynchronous design, it is capable of reacting very quickly. However, the use of analog circuitry introduces several other drawbacks. Analog circuitry can be very sensitive, and is very often affected by electrical noise, especially in high power applications. This causes what is known as "waveform jitter." This phenomenon causes distortion in the power waveform, which results in a loss of precision in the control of the power supply. Furthermore, not only does the waveform jitter phenomenon cause a loss of precision in controlling the switching of the power supply, it also causes a loss of repeatability in the output from the plasma generator. Accordingly, analog circuitry that is susceptible to this waveform jitter makes it an unacceptable alternative phenomenon in high-density chip fabrication, which requires very precise control of the power supply.

Similarly, there also exists a need in the area of consumer electronics for such a precise, robust and easily tunable pulse width modulation power supply. Power systems typically used in personal computers are often placed under rigorous demands. For example, a power supply in a computer may be required to supply different voltages within a very short amount of time. This may occur when a computer switches from "sleep" or "standby" mode to "active" mode. In this situation, a power system in a personal computer typically will have to change the load current at a rate that may exceed 30 amps per microsecond. Such requirements are typically satisfied by a fast response DC/DC converter located very close to the microprocessor. Similarly, many DC/DC converters, for example, the Voltage Regulator Module (VRM) for many microprocessors manufactured by Intel, require the output voltage from a power supply to be digitally programmable.

Typically, these problems have been addressed through the use of analog circuitry. However, for the reasons discussed above, the use of analog circuitry is often unsatisfactory. Similarly, as discussed above, the use of purely digital circuitry is also often an unacceptable alternative due to the prohibitive cost. Accordingly, there exists a need for a low cost, high precision solution.

SUMMARY OF THE INVENTION

In an embodiment of the invention, a pulse width modulation controlling circuit for a power supply is disclosed. This pulse width modulation controlling circuit for a power supply comprises:

a processor for generating a time-length signal, a counting means for receiving a first portion of the time-length signal, and counting in discrete coarse steps to a predetermined number determined by the first portion of the time-length signal, and outputting a coarse adjusted signal, a delay means operatively connected to the counting means for receiving the coarse adjusted signal, and a selection means coupled to the delay means for receiving a second portion of the time-length signal and for selecting a predetermined discrete delay period in the delay means, for creating discrete time steps, whereby the power supply is capable of providing a plurality of repeatable output pulses.

In another embodiment of the invention, a method for controlling a switchmode power supply is disclosed. This method comprises outputting a time-length signal from a processing means, transmitting a first portion of the time-length signal to a counting means, and a second portion of the time-length signal to a selection means, counting to a number based on the first portion of the time-length signal received by said counting means, outputting a coarse adjusted signal from the counting means after counting to said predetermined number, selecting a delay from a delay means based on the second portion of the time-length signal received by the selection means, delaying the coarse adjusted signal a predetermined length of time based on the selected delay in the delay means; and outputting an output signal after the predetermined delay.

In another embodiment of the invention, a pulse width modulation controlling circuit for a power supply is disclosed. This pulse width modulation controlling circuit for a power supply comprises:

a processor means for generating a time-length signal, a first selection means for receiving a first portion of the time-length signal, and for selecting one of a plurality of counting means, wherein the selected one of said plurality of counting means receives the first portion of the time-length signal, and counts in discrete coarse steps to a predetermined number determined by the first portion of the time-length signal, the selected one of the plurality of counting means outputting a coarse adjusted signal, a delay means operatively connected to the counting means for receiving the coarse adjusted signal, and a second selection means coupled to said delay means for receiving the second portion of the time-length signal and for selecting a predetermined discrete delay period in the delay means, for creating discrete time steps, whereby the power supply is capable of providing a plurality of repeatable output pulses.

In yet another embodiment of the invention, a pulse width modulation controlling circuit for a power supply is disclosed. This pulse width modulation controlling circuit for a power supply comprises, a processor means for generating a time-length signal, a counting means for receiving a first portion of the time-length signal, and counting in discrete coarse steps to a predetermined number determined by the first portion of said time-length signal, and the counting means outputting a coarse adjusted signal, a delay selection means for receiving the second portion of the time-length signal, a plurality of delay means operatively connected to the plurality of counting means for receiving the coarse adjusted signal, and a plurality of second selector means, wherein the delay selection means selects one of the plurality of second selector means, and wherein a second selector means is coupled to each one of the plurality of delay means, the selected one of the plurality of second selector means for selecting a predetermined discrete delay period in one of the plurality of delay means, for creating discrete time steps, whereby the power supply is capable of providing a plurality of repeatable output pulses.

In still another embodiment of the invention, a pulse width modulation controlling circuit for a power supply is disclosed. This pulse width modulation controlling circuit for a power supply comprises a processor means for generating a time-length signal, a first selection means for receiving a first portion of the time-length signal, and for selecting one of a plurality of counting means, wherein the selected one of the plurality of counting means receives the first portion of the time-length signal, and counts in discrete coarse steps to a predetermined number determined by the first portion of the time-length signal, the selected one of the plurality of counting means outputting a coarse adjusted signal, a delay selection means for receiving the second portion of the time-length signal, a plurality of delay means operatively connected to the plurality of counting means for receiving the coarse adjusted signal, and a plurality of second selector means, wherein the delay selection means selects one of the plurality of second selector means, and wherein a second selector means is coupled to each one of the plurality of delay means, the selected one of the plurality of second selector means for selecting a predetermined discrete delay period in one of the plurality of delay means, for creating discrete time steps, whereby the power supply is capable of providing a plurality of repeatable output pulses.

DETAILED DESCRIPTION

Figure 1:
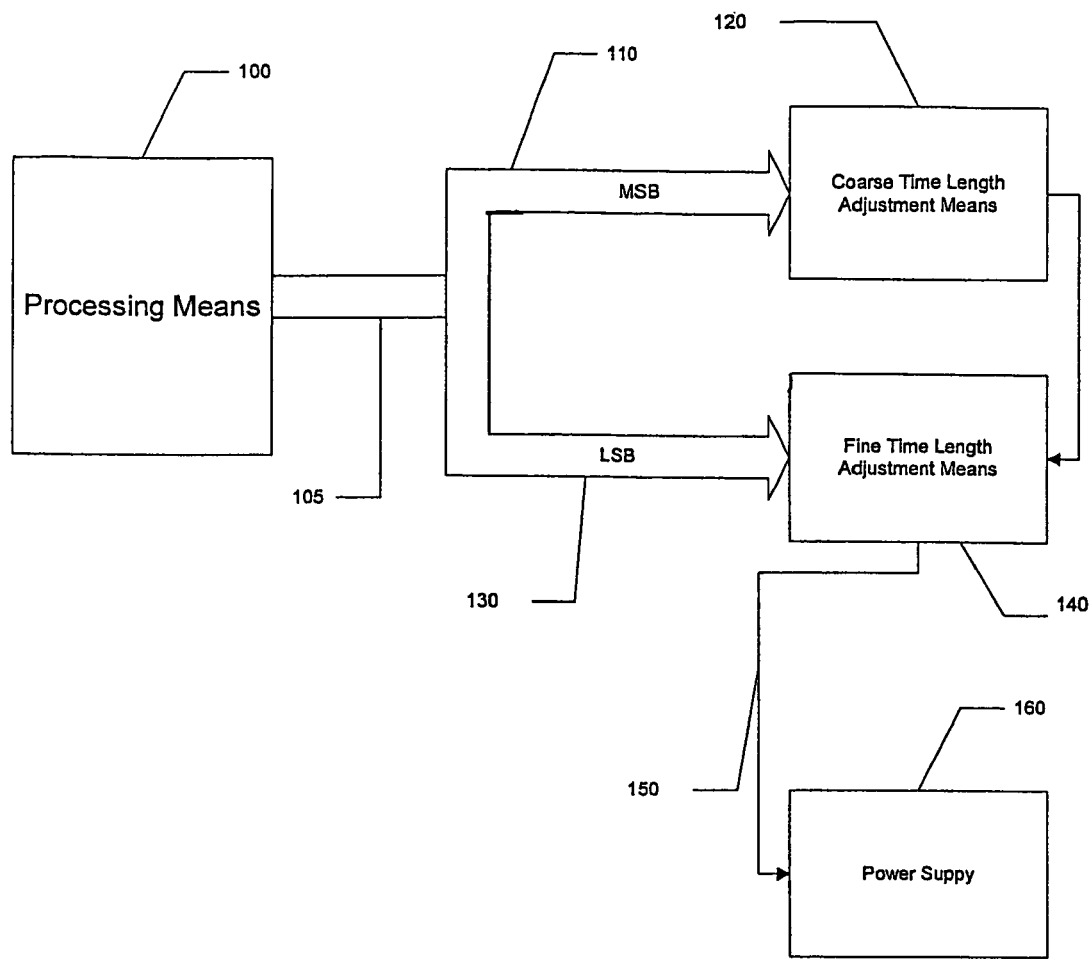
FIG. 1 is a general block diagram of a preferred embodiment present invention.

Referring now to FIG. 1, a general block diagram of a preferred embodiment of the present invention is shown. Generally, the Higher Pulse Width Resolution for Switchmode Power Supply Control comprises a processing means 100, a coarse time-length adjustment means 120, fine time-length adjustment means 140, and an output 150. The processing means may be any suitable processor or device capable of generating the required time-length signal or any circuit capable of storing and executing a control algorithm. It can be a microprocessor, a Digital Signal processor (DSP), a PC or any other suitable device. Although the output 150 is depicted in FIG. 1 as being connected to power supply 160, this is for illustrative purposes only, and, as will be apparent from the following disclosure, the present invention can be used in any application that requires higher control circuit resolution. Moreover, as discussed above, it may be used in a wide array of applications, from personal electronics to industrial Radio Frequency applications.

Figure 2:
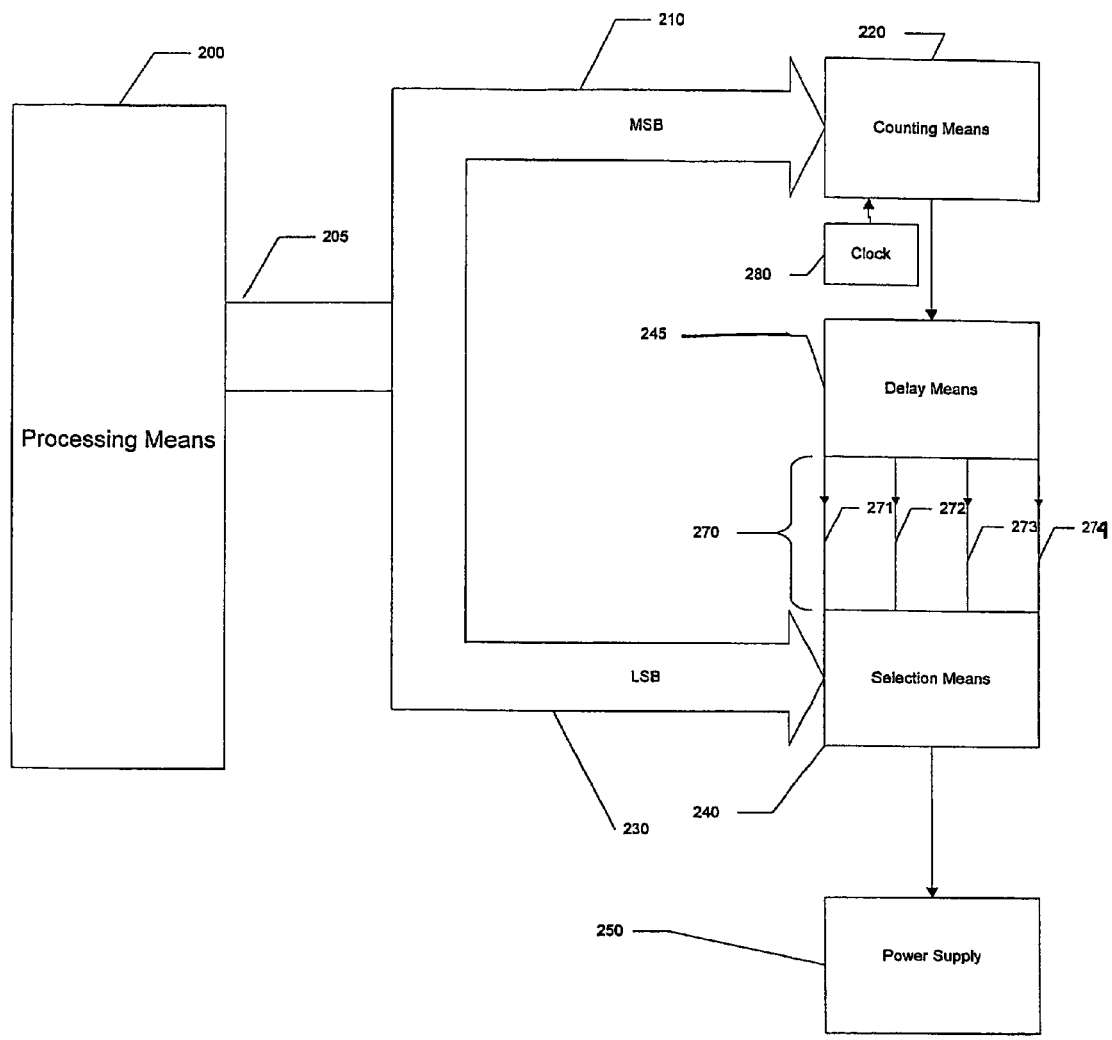
FIG. 2 is a more detailed block diagram of the embodiment of FIG. 1 of the present invention.

Referring now to FIG. 2, the embodiment depicted in FIG. 1 of the present invention is shown in more detail. Broadly speaking, the present invention can accomplish precise control over the switching of a device by coarsely and then finely adjusting the time-length signal generated by the processing means 200. First, the present invention coarsely counts to the requested time-length by counting in discrete steps to the number indicated by the most significant portion of the time-length signal 210, and then finely adjusting the coarse signal by delaying the coarse-adjusted signal with delay means 245.

This time-length signal may be divided in any manner that is practical. It may be divided by connecting the most significant bits of the bus 205 to the counting means 220, and the least significant bits to the selection means 210. Similarly, a PLD may be used to divide the signal. Alternatively, the signal may be transmitted from the processor as two separate signals. In order to more fully understand the present invention, the following will detail this process.

In order to facilitate the coarse and fine adjustments to the timing signal, the time-length signal from processing means 200 is output onto bus 205 and divided into a coarse time-length signal 210 and a fine time-length signal 230. The course time-length signal 210 comprises the most significant bits of the time-length signal 205, and is received by the counting means 220. The fine time-length signal 230 comprises the least significant bits of the time-length signal 205, and is received by the selection means 240.

Upon receiving the coarse time-length signal, the counting means counts to a number defined by the coarse time-length signal in discrete steps. The counting means may be implemented using any type of conventional counting circuitry, such as a digital counter. The counting means 220 operates at a frequency determined by clock 280; the frequency of the clock will determine the resolution of the counting means 220. Accordingly, the counting resolution of the counting means 220 will be the inverse of the frequency of clock 280.

Once the counting means 220 receives the coarse time-length signal 210 and counts the number of clock cycles indicated by the coarse time-length signal, the counting means outputs a coarse-adjusted signal to the delay means 245. By way of example, if the coarse time-length signal is four seconds, the counting means 220 will count out four of its clock cycles (assuming its frequency is one second), and then output a coarse-adjusted signal to the delay means 245.

As the counting means 220 receives the coarse time-length signal, the selection means 240 receives the fine time-length signal 230. As discussed above, the fine time-length signal 230 comprises the least significant bits of the time-length signal 205. The selection means 240 also receives all the output signals from the delay means 245. The selection means 240 may be any circuit device that is capable of selecting from a plurality of inputs; for example, a multiplexor or a PLD may be used. As will be more thoroughly discussed below, the delay means 245 delays the coarse-adjusted signal received from the counting means 220 from reaching the power supply 250 in predetermined increments. So, for example, output 272 of the delay means 245 delays the coarse adjusted signal a predetermined amount more than output 271 of the delay means 245. The selection means 240 selects one of these predetermined delays to use (i.e., 271, 272, 273, or 274). This selection is based on the fine time-length signal 230 received by the selection means 240.

The delay means 245 allows the fine adjustment of the time-length signal by delaying the coarse-adjusted signal a selectable, predetermined length of time. In a preferred embodiment of the present invention, this is accomplished through the use of analog circuitry. An example of how the delay means may be constructed is illustrated in FIG. 3.

Figure 3:
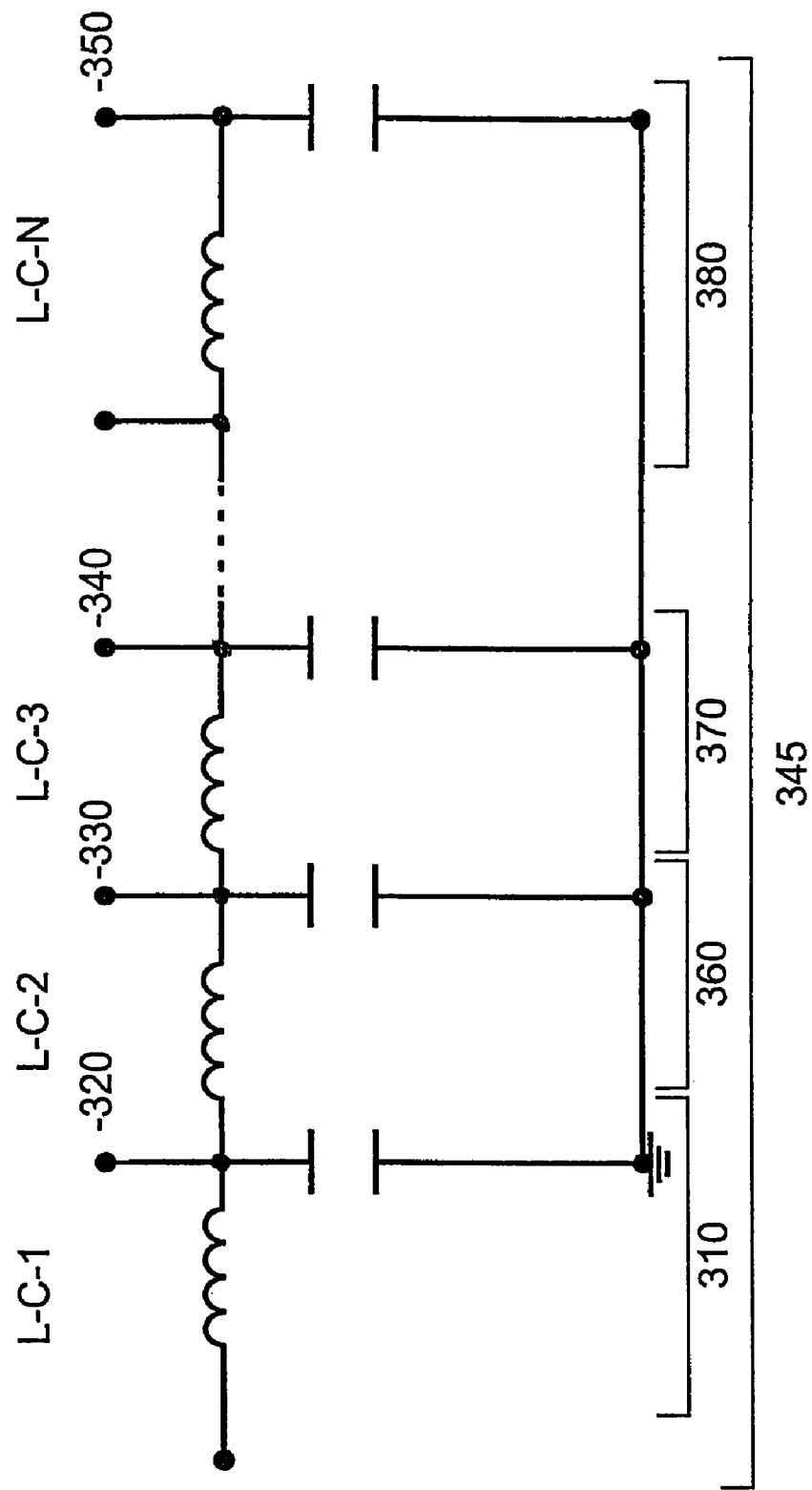
FIG. 3 is a schematic diagram of a particular aspect of the embodiment of FIG. 1 of the present invention.

As can be seen from FIG. 3, the delay means 345 may be implemented using a delay line comprising an inductor-capacitor series-parallel circuit, with a delay tap after each inductor-capacitor section. After each inductor-capacitor section, for example inductor-capacitor section 1 310, the signal is delayed a predetermined amount. The length of the delay at each tap is determined by the values of the inductors and capacitors in the delay line. The desired amount of delay can be obtained by selecting a delay tap after the desired inductor-capacitor section, for example delay tap 320. Thus, the output signal transmitted from the delay means 345 is progressively delayed a predetermined length at each delay tap of the delay means.

Although in the preferred embodiment the delay line is constructed using inductors and capacitors, it may also be constructed using any other suitable elements or configuration, whether they are digital or analog. For example, the delay line may be constructed using semiconductor-based digital components, or virtually any other circuitry that exhibits a predictable time delay.

Referring now back to FIG. 2, each delay tap (i.e., 271, 272, 273, or 274) is connected to the selection means 240. The selection means 240 selects one of the delay taps from the delay means 245 when the selection means 240 receives the fine time-length signal 230 from the processing means 200. The delay means 245 delays the course adjusted signal received from the counting means 220, which the selection means 240 receives through the selected delay tap. Once the coarse-adjusted signal has been properly delayed, the selection means 240 outputs a signal to the power supply 250.

In order to affect a better understanding of the present invention, the following will detail, by way of example, a switch of the power supply control in accordance with the present invention. This is by way of example only, and is not intended to limit the present invention to the values or structures specified.

Figure 4:
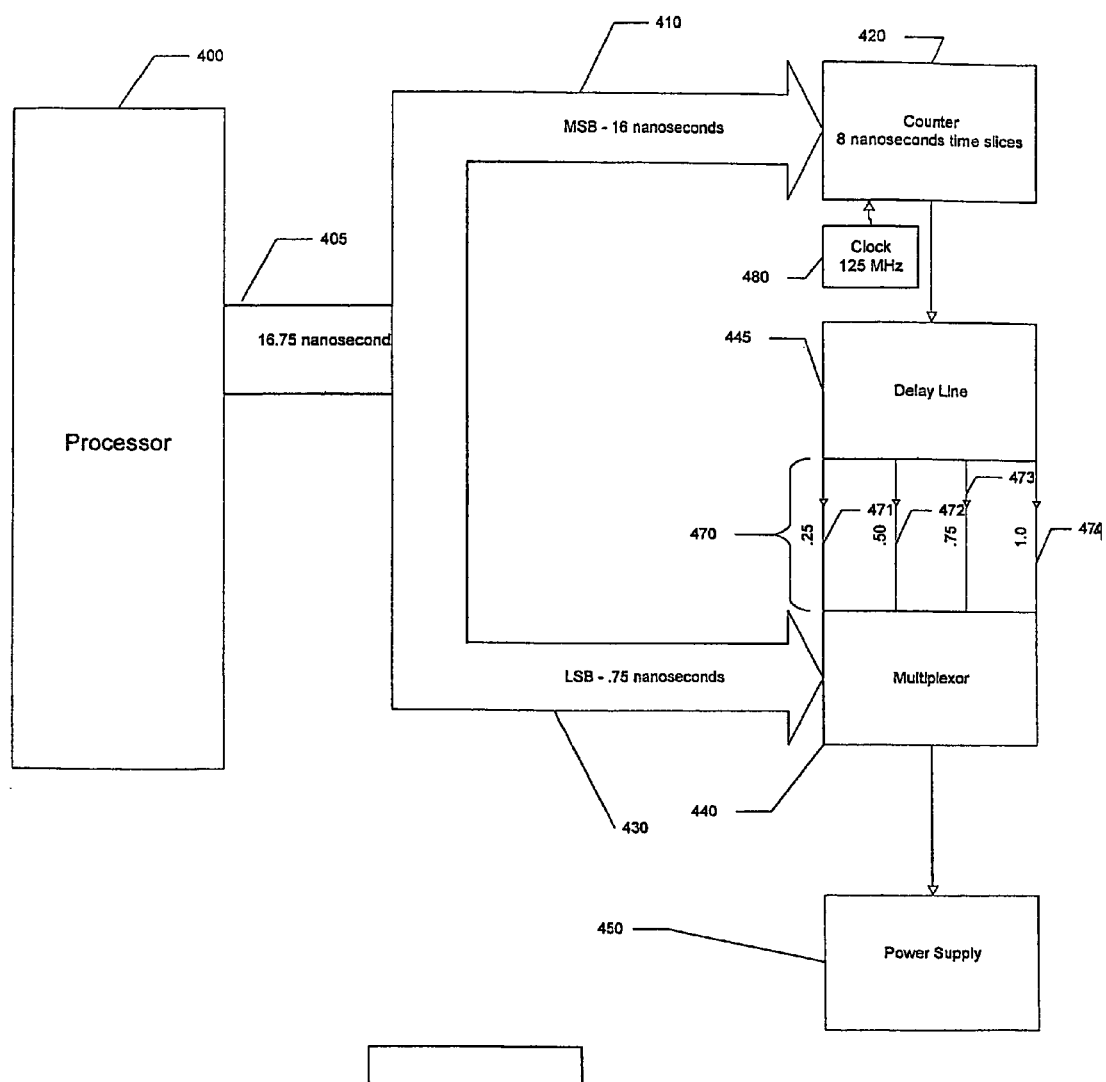
FIG. 4 is a block diagram similar to FIG. 2, of an exemplary embodiment in accordance with the present invention.

FIG. 4 illustrates a processor 400, a counter 420, a multiplexor 440, a delay line 445, and a clock 480. For purposes of this example, the clock 480 oscillates at 125 MHz. As discussed above, the frequency of the clock will determine the resolution of the counter; thus, the counter will have a resolution of $\frac{1}{125}$ MHz, or eight nanoseconds. It will, accordingly, not be able to respond to time-length signals shorter than eight nanoseconds.

In this example of the present invention, the processor 400 will first output a time-length signal onto bus 405. For purposes of this example, the time-length signal is 16.75 nanoseconds. As previously mentioned, the counter 420 in this example does not have sufficient resolution to react to the 0.75 nanoseconds requested by the processor. In this example, the least significant bits (the binary representation of 0.75) are sent to the multiplexor 440, while the most significant bits (the binary representation of 16) are sent to the counter 420. Since the counter 420 counts in steps of eight nanoseconds, it will transmit a coarse-adjusted signal to the delay line 445 after it has counted two clock cycles, for a total of 16 nanoseconds.

As the counter 420 receives the coarse time-length signal 410, the multiplexor 440 receives the fine time-length signal 430 from the processor 400. The multiplexor 440 selects a specific delay tap from the delay line 445. The delay line receives the coarse-adjusted signal from the counter 420, and outputs the appropriately delayed signal on the selected delay tap, to the multiplexor 440. In the present example, the delay line delays the coarse-adjusted signal in increments of 0.25 nanoseconds. Accordingly, in the present example, the signal should be delayed an additional 0.75 nanoseconds, in order to obtain the originally requested time-length of 16.75 nanoseconds. Based on the fine time-length signal 430 received by the multiplexor 440 from the processor 400, the multiplexor 440 will select the delay tap 473, for a 0.75 nanosecond delay. This will cause the coarse-adjusted signal to be delayed an additional 0.75 nanoseconds. This properly delayed signal is then output by the multiplexor 440 to the power supply 450.

Figure 5:
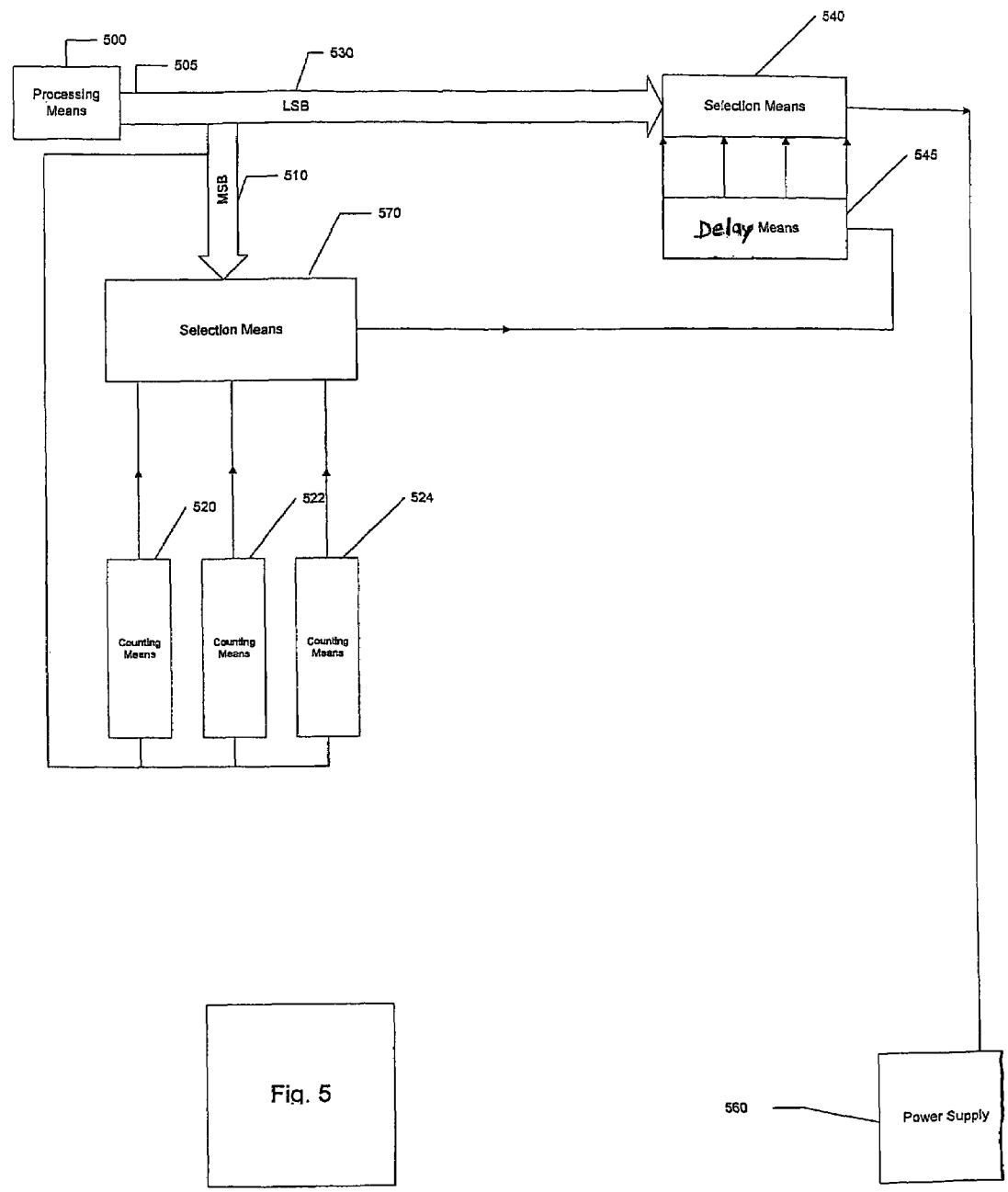
FIG. 5 is a block of diagram of an alternative embodiment of the present invention.
Figure 6:
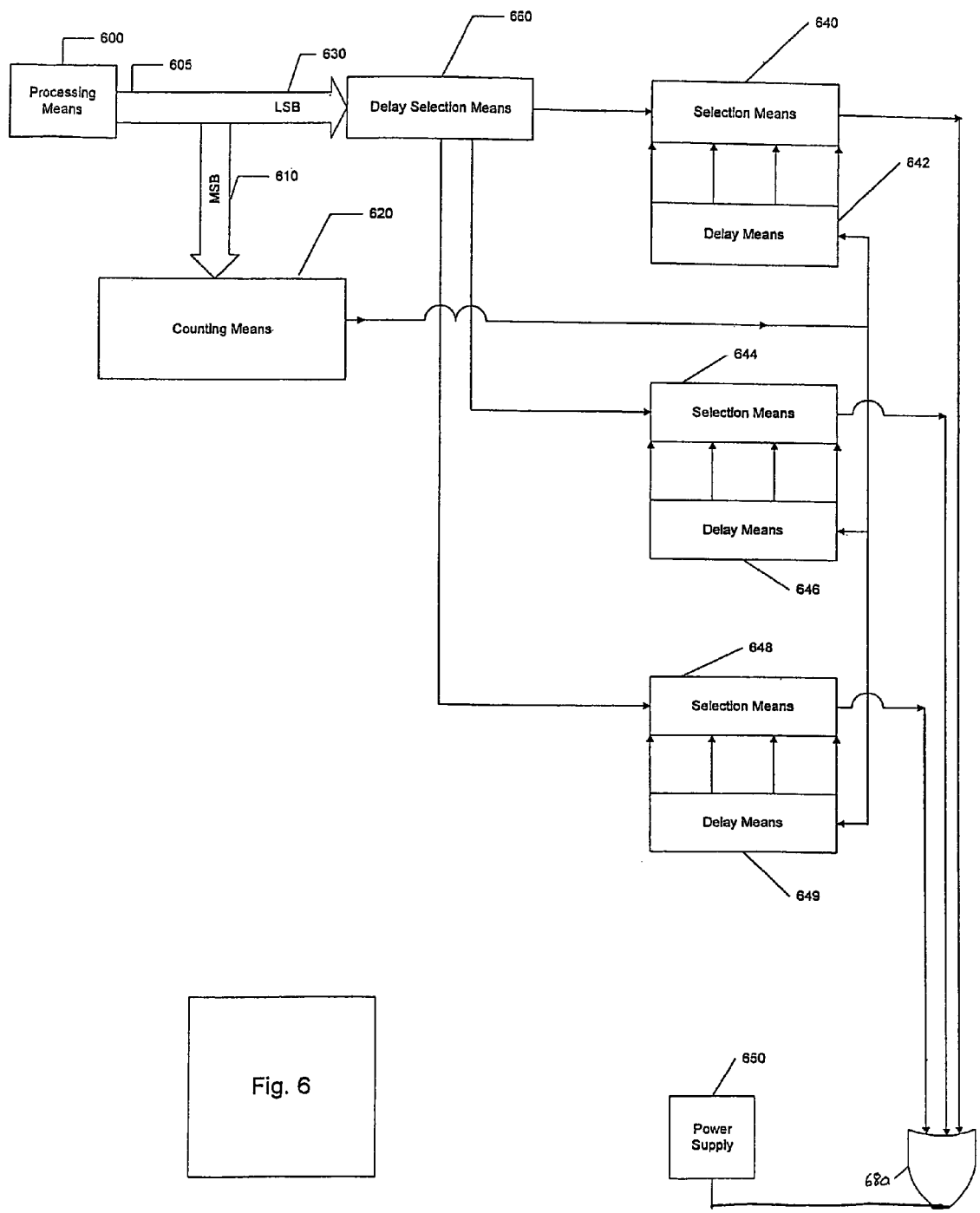
FIG. 6 is a block diagram of another alternative embodiment of the present invention.
Figure 7:
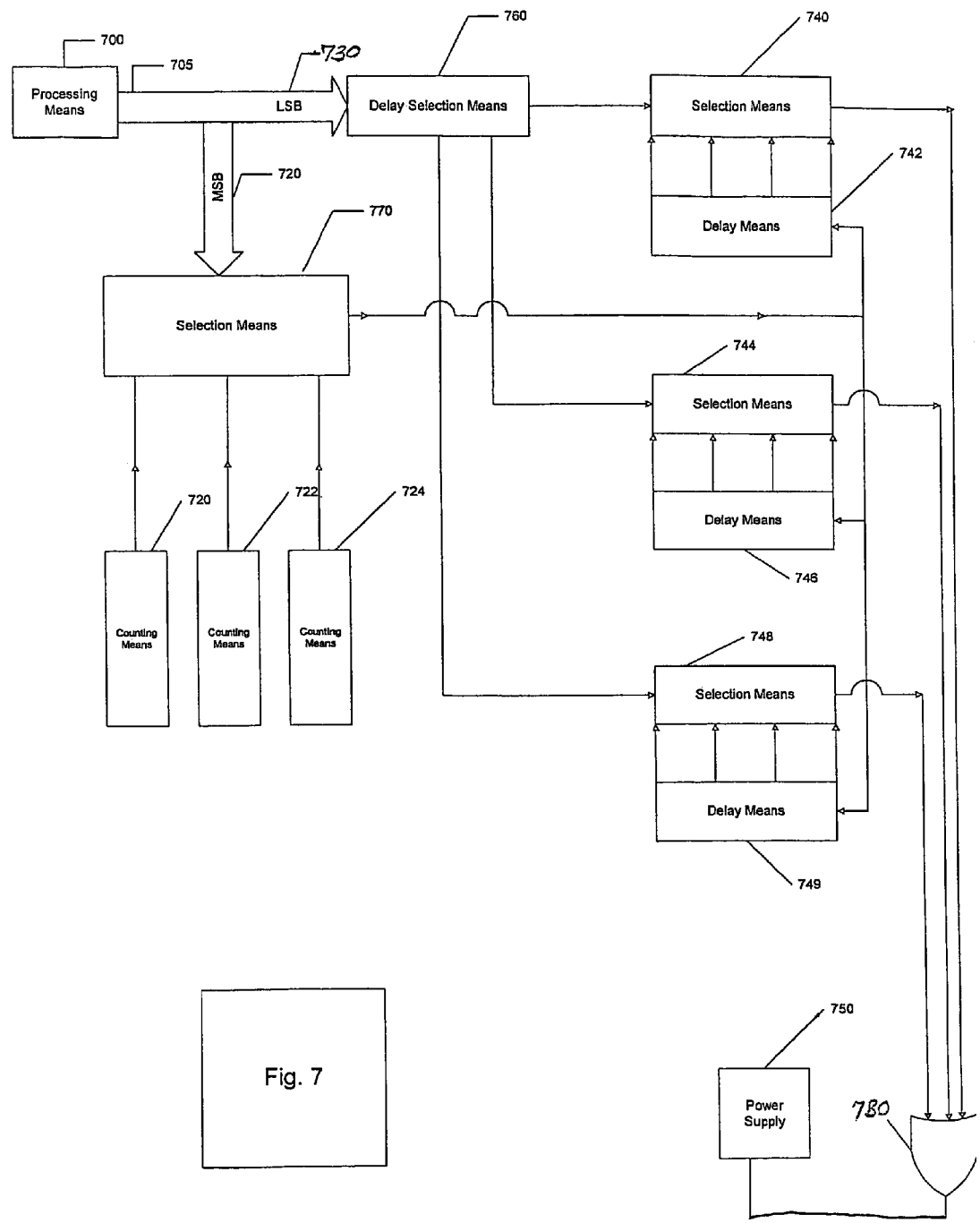
FIG. 7 is a block diagram of still another alternative embodiment of the present invention.

FIGS. 5, 6, and 7 illustrate alternative embodiments of the present invention. In these embodiments, the invention may be used for situations where greater ranges and flexibility of the counting and delay means is desired. This is accomplished by using additional counting means (FIG. 5), additional delay means (FIG. 6), or a combination of additional delay means and counting means (FIG. 7) in addition to the selection means 540 and the delay means 545.

As illustrated in FIG. 5, an alternative embodiment of the present invention comprises a plurality of counting means 520, 522, and 524. Although three counting means are depicted in FIG. 5, any number of counting means may be used. In operation, the selection means 570 selects one of the counting means, based on the coarse time-length signal 510. Once the selected counting means counts to the requested number, the counting means selection means 570 outputs the course-adjusted signal to the delay means 545.

As discussed above, as the selection means 570 receives the coarse time-length signal 510, the selection means 540 receives the fine time-length signal 530 from the processing means 500. The selection means 540 selects a specific delay tap from delay means 545. The delay means 545 receives the coarse-adjusted signal from the selection means 570, and outputs the appropriately delayed signal on the selected delay tap, to the selection means 540. The properly delayed signal is output by the selection means 540 to the power supply.

Turning now to FIG. 6, another alternative embodiment is shown. This embodiment generally comprises delay selection means 660, selection means 640, 644, and 648, and delay means 642, 646, and 649, in addition to processing means 600 and counting means. Although three delay means/selection means combinations are depicted in FIG. 6, any number of delay means/selection means combinations may be used.

As the counting means 620 receives the coarse time-length signal 610, the delay selection means 660 receives the fine time-length signal 630 from the processing means 600. The delay selection means 660 selects one of the delay means/selection means combinations (e.g., 640/642, 644/646, 648/649) based on the fine time-length signal 630. Once the appropriate delay means/selection means combination has been selected. The selected selection means selects a specific delay tap from the selected delay means, the selected delay means (e.g., selection means 644) receives the coarse adjusted signal from the counting means 620, and outputs the appropriately delayed signal on the selected tap to the selected selection means (e.g., selection means 644). The properly delayed signal is output by the selected selection means (e.g., selection means 644) to logical or gate 680, which transmits the output to power supply 650. The "or" gate 660 allows the output of any of the selected delay means/selection means combination to reach the power supply 650.

Turning now to FIG. 7, yet another embodiment of the present invention is shown. In this embodiment, the flexibility of the first and second embodiments, i.e., multiple counting means and delay means, is achieved.

The alternative embodiment illustrated in FIG. 7 comprises a plurality of counting means 720, 722, and 724, selection means 770, delay selection means 760, selection means 740, 744, and 748, delay means 742, 746, and 749, and logical OR gate 780. Although three counting means are depicted in FIG. 7, any number of counting means may be used. Similarly, although three delay means/selection means combinations are shown, any number may be used.

In operation, the selection means 770 selects one of the counting means, based on the coarse time-length signal 720. Once the selected counting means counts to the requested number (based on the coarse time-length signal 720), the selection means 770 outputs the course-adjusted signal to the delay means 742, 746, and 749.

The delay selection means 760 selects one of the delay means/selection means combination (e.g., 740/742, 744/746, 748/749) based on the fine time-length signal 730. Once the appropriate delay means/selection means combination has been selected (e.g., delay means/selection means 746/744) the selected selection means (e.g., selection means 744) selects a specific delay tap from the selected delay means (e.g., delay means 746). The selected delay means receives the coarse-adjusted signal from the selection means 770, and outputs the appropriately delayed signal on the selected tap to the selected selection means. The properly delayed signal is output by the selected selection means to logical OR gate 780, which transmits the output to power supply 750. The logical OR gate 780 allows the output of any of the selected delay means/selection means combination to reach the power supply 750.

Figure 8:
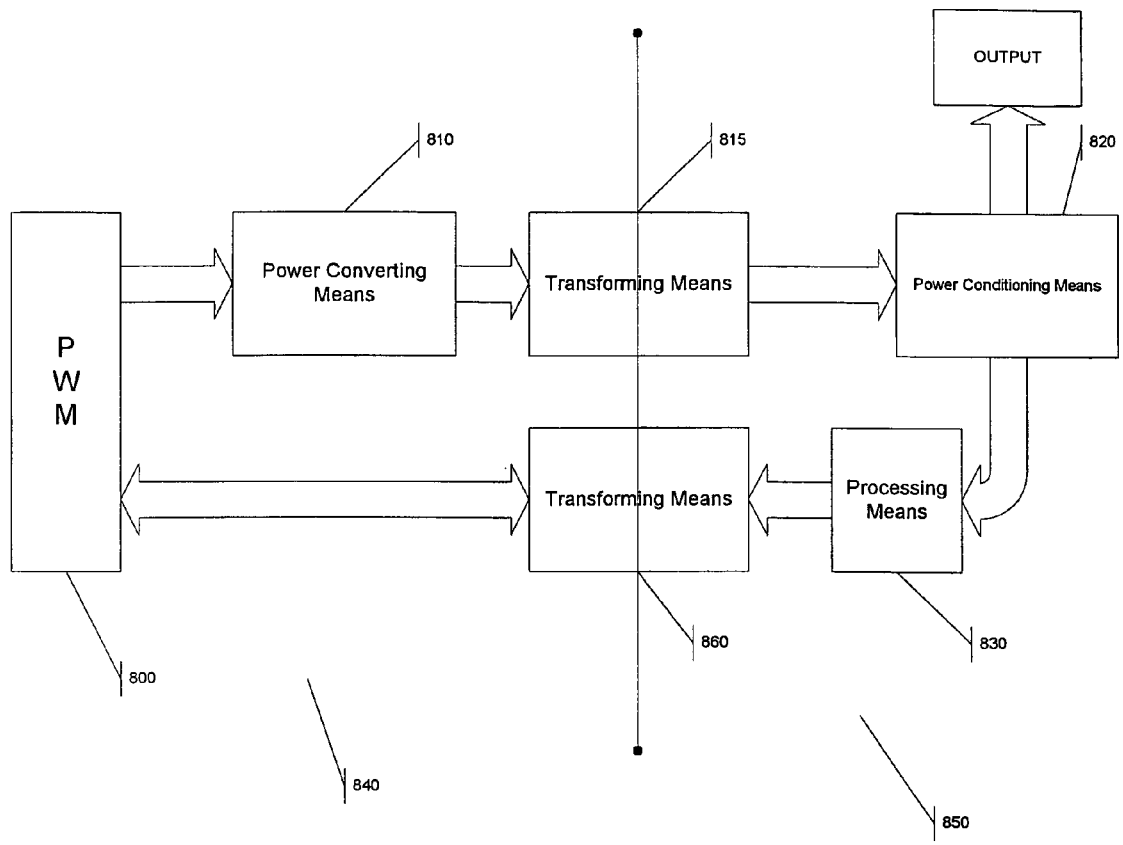
FIG. 8 is a block diagram of yet another alternative embodiment of the present invention.
Figure 9:
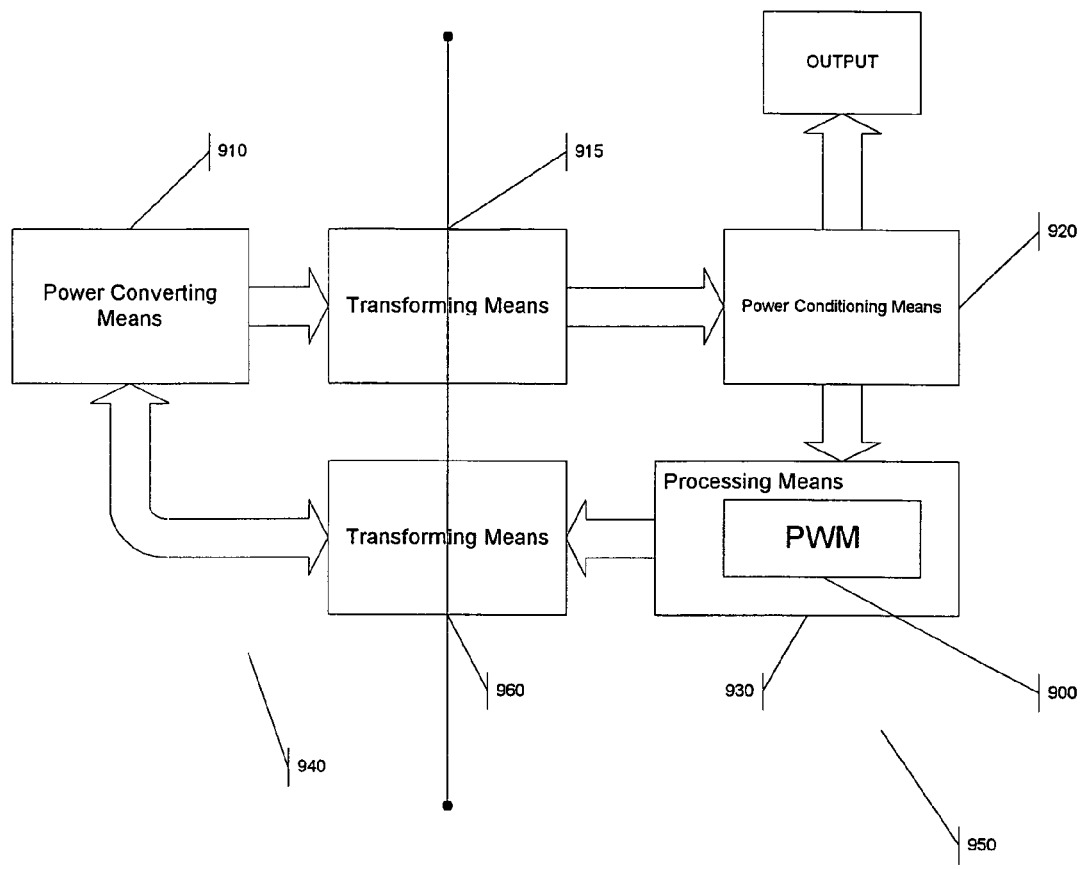
FIG. 9 is a block diagram of one more alternative embodiment of the present invention.

As discussed above, the present invention may be used in virtually any application that requires precise, robust and easily tunable pulse width modulation. The present invention is not limited to use in plasma operations. Rather, it may be used in many other applications. In particular, it is also well suited for use in the area of consumer electronics. By way of example, the present invention may be used in power supplies of personal computers. Such an application is depicted in both FIGS. 8 and 9. FIG. 8 depicts an embodiment where the present invention may be used in a low voltage power supply, such as a power supply for a personal computer. FIG. 9 depicts another embodiment where the present invention may also be used in a low voltage power supply. The following will detail these embodiments.

As shown in FIG. 8, a typical low voltage power supply comprises a primary side 840 and a secondary side 850. Typically, the primary side 840 is connected to the input power source, and is considered a hazardous circuit, i.e., it would be dangerous for a person to handle it directly. The secondary side 850, however, is typically rated as safe to be handled by a person. In order to convert the primary side 840 voltage to safe, secondary side 850 voltage, power converting means 810 and power conditioning means 820 are coupled between the primary side 840 and secondary side 850. The power converting means 810 may be constructed using any suitable digital component, for example, single or multiple semiconductor switching devices may be used. Similarly, the power conditioning means 820 may also be constructed from any suitable digital component. For example, the power conditioning means 820 may be constructed from a single or multiple semiconductor rectification device, such as a filter, bridge rectifier or DC built storage capacitor, available from ENI. The transforming means 815 may be any suitable, commercially available transformer designed to transfer power.

Similarly, in order to convert power form secondary side 850 to primary side 840, transforming means 860 is coupled between the secondary side 850 and primary side 840. The transforming means 860 may be any suitable, commercially available transformer designed to handle control signals.

In the embodiment depicted in FIG. 8, the present invention is separated into two sections; the processing means 830, and the PWM 800. The PWM 800 of the present invention is located in the primary side 840. The PWM 800 receives a time length signal from the processing means 830. As discussed above, the processing means 830 may be any suitable processor or device capable of generating the required time-length signal, or any circuit capable of storing and executing a control algorithm. The processing 830 also receives the delayed time length signal output from the PWM 800, and can adjust the time length signal output to the PWM 800 if necessary.

FIG. 9 depicts yet another embodiment of the present invention. In this embodiment, as in the embodiment previously discussed, a power converting means 910, a transforming means 915, and a power conditioning means 920 is coupled between the primary side 940 and secondary side 950, and is used to convert power entering the secondary side 950. Similarly, a transforming means 960 is used to convert power entering the primary side 940 from the secondary side 950. In this embodiment, however the PWM 900 is disposed on the DSP 930. This embodiment is advantageous in that it uses less components, is less expensive, is easier to fabricate, and consumes less power.

While the invention has been described in respect to the above embodiments of the invention, it should be understood that the invention is not limited to these precise embodiments. Rather, many modifications and variations will present themselves to persons skilled in the art without departure from the scope and spirit of the inventions, which is defined in the appended claims.

What is claimed is:

1. A method for controlling a switchmode power supply comprising:
   generating a time-length signal that includes a first portion and a second portion that indicate a pulse duration of an output signal;
   transmitting the first portion of said time-length signal to a counting means, and the second portion of said time-length signal to a selection means;
   counting to a number based on said first portion of said time-length signal received by said counting means;
   outputting a coarse adjusted signal from said counting means after counting to said predetermined number;
   selecting a delay from a delay means based on said second portion of said time-length signal received by said selection means;
   delaying said coarse adjusted signal a predetermined length of time based on said selected delay in said delay means; and
   outputting the output signal after said predetermined delay.

2. A method for controlling a switchmode power supply in a plasma chamber comprising:
   generating a time-length signal that includes a first portion and a second portion that indicate a pulse duration of an output signal;
   transmitting the first portion of said time-length signal to a counting circuit, and the second portion of said time-length signal to a selection circuit;
   counting to a number based on said first portion of said time-length signal received by said counting circuit;
   outputting a coarse adjusted signal from said counting circuit after counting to said predetermined number;
   selecting a delay from a delay circuit based on said second portion of said time-length signal received by said selection circuit;
   delaying said coarse adjusted signal a predetermined length of time based on said selected delay in said delay circuit; and
   outputting the output signal to said power supply in said plasma chamber after said predetermined delay.

3. The method of claim 2, wherein said counting circuit is a digital circuit.

4. The method of claim 3, wherein said digital counting circuit comprises a programmable logic device.

5. The method of claim 4, wherein said counting circuit comprises an oscillator means operating at a predetermined frequency.

6. The method of claim 5, wherein said oscillator oscillates at approximately 125 MHz.

7. The method of claim 2, wherein said delay circuit delays in increments of 0.25 nanoseconds.

8. The method of claim 2, wherein said delay circuit is an analog circuit.

9. The method of claim 2, wherein said delay circuit is a digital circuit.

10. The method of claim 8, wherein said delay circuit comprises a plurality of inductors and capacitors connected in a series-parallel configuration.

11. The method of claim 2, wherein said selection circuit is a digital selection circuit.

12. The method of claim 2, wherein said selection circuit is a multiplexor.

13. The method of claim 2, wherein said processor operates at a first voltage, and said counting circuit, delay circuit, and selection circuit operates at a second voltage.

14. The method of claim 13, wherein said apparatus further comprises a first and second transform circuit, a power converter, and a power conditioner, wherein an output of said processor is coupled to said first transform circuit for transforming said output of said processor at said first voltage to said second voltage, and an output of said second selection circuit is coupled to said power converter, said second transformer means is coupled to said power converting means, said second transform circuit, and said power conditioner.

15. The method of claim 2, wherein said counting circuit, said delay circuit and said selection circuit is disposed in said processor.

16. The method of claim 2, wherein the step of generating a time-length signal further comprises generating said time-length signal in a processor.

17. The method of claim 2, wherein said counting circuit is a digital circuit.

* * * * *